(12) United States Patent
Lin (10) Patent No.: US 12,326,462 B2
(45) Date of Patent: Jun. 10, 2025

(54) PROBE HEAD AND PROBE ASSEMBLY

(71) Applicant: AZOTH STUDIO LTD. CO., New Taipei (TW)

(72) Inventor: Zhou Yi Lin, New Taipei (TW)

(73) Assignee: AZOTH STUDIO LTD. CO., New Taipei (TW)

( * ) Notice: Subject to any disclaimer, the term of this patent is extended or adjusted under 35 U.S.C. 154(b) by 169 days.

(21) Appl. No.: 18/223,681

(22) Filed: Jul. 19, 2023

(65) Prior Publication Data

US 2024/0036073 A1 Feb. 1, 2024

(30) Foreign Application Priority Data

Jul. 29, 2022 (TW) .................................. 111128543

(51) Int. Cl.
*G01R 1/067* (2006.01)

(52) U.S. Cl.
CPC ..... *G01R 1/06738* (2013.01); *G01R 1/06722* (2013.01); *G01R 1/06744* (2013.01); *G01R 1/06755* (2013.01)

(58) Field of Classification Search
CPC ............ G01R 1/06738; G01R 1/06722; G01R 1/06744; G01R 1/06755; G01R 1/06733
See application file for complete search history.

(56) References Cited

U.S. PATENT DOCUMENTS

| | | | |
|---|---|---|---|
| 2013/0099811 A1* | 4/2013 | Lee ..................... | G01R 1/06722 324/754.11 |
| 2020/0124637 A1* | 4/2020 | Chung .................... | G01R 3/00 |

* cited by examiner

*Primary Examiner* — G. M. A Hyder (57) ABSTRACT

A probe head for electrical detection of semiconductor devices and a probe assembly including the same are provided. The probe head includes: a probe head body; and at least one polygon cone shaped contact portion coupled to an end face of the probe head body. The probe head body includes at least three body portions sequentially stacked and coupled axially, the second body portion has an outer diameter greater than the first and third body portions. The at least one contact portion is disposed around the periphery of the end face of the probe head body. Each contact portion has an inclined edge or inclined plane inclined upward and outward from a central portion of the probe head body and oriented to facing a central axis of the probe head body. The first body portion has a hardness greater than or equal to the at least one contact portion.

18 Claims, 8 Drawing Sheets

PROBE HEAD AND PROBE ASSEMBLY

CROSS-REFERENCE TO RELATED APPLICATION

This application claims the priority of Taiwanese patent application No. 111128543, filed on Jul. 29, 2022, which is incorporated herewith by reference.

BACKGROUND OF THE INVENTION

1. Field of the Invention

The present invention relates to a probe head, and more particularly, to a probe with an improved recessed deformation level caused by the probe head on an object to be tested and an improved contact position.

2. The Prior Arts

In the semiconductor manufacturing industry, after the manufacture of a semiconductor device is completed, electrical detection must be performed to confirm whether the semiconductor device is reliable and can operate normally. During the detection, the detection on the semiconductor device is usually performed by using a test device and test sockets, wherein the test device includes test pads, and the test sockets are used to connect the terminals of the semiconductor device to the test pads of the test device, thereby establishing an electrical connection between the terminals of the semiconductor device and the test device for electrical signal exchange.

Figures 1A, 1B:
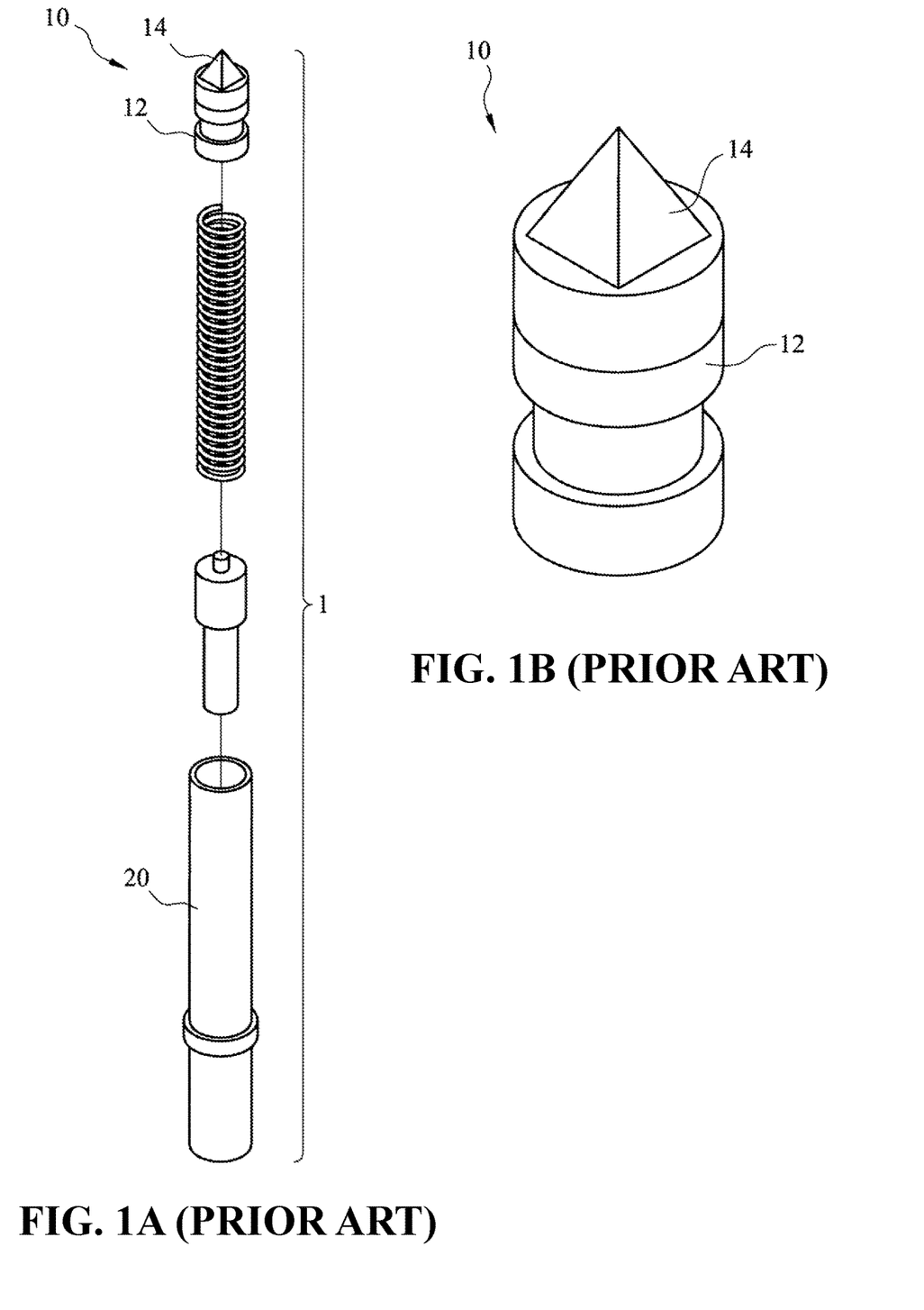
FIGS. 1A and 1B are a schematic exploded view of a conventional probe assembly and a conventional probe head, respectively.
Figure 2A:
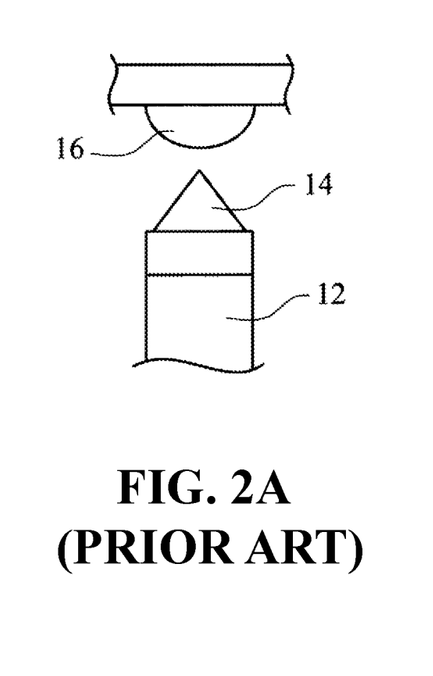
FIGS. 2A and 2B are schematic views showing a contact between a conventional probe head and a bump of a terminal of a semiconductor device.
Figure 2B:
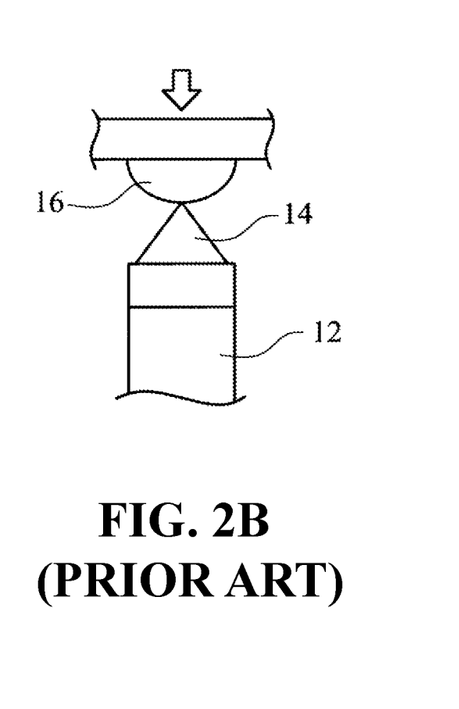

Usually, a probe array is provided as a testing member in the test socket, and the probe array includes a plurality of probe assemblies, and each probe assembly substantially includes a probe head, an elastic member, and a sleeve coupled with the probe head. As an example, FIGS. 1A and 1B show an exploded perspective view of a conventional probe assembly 1, which substantially includes a probe head 10 and a sleeve 20 coupled with the probe head 10. As shown in FIGS. 1A and 1B, the probe head 10 includes a probe head body 12 and a contact portion 14 formed at one end of the probe head body 12. As shown in FIGS. 1A and 1B, the contact portion 14 of the conventional probe head 10 is a pyramidal cone structure. When using this conventional probe head 10 to perform detection on the semiconductor device, the contact portion 14 of the probe head 10 will contact a bump 16 of the terminal of the semiconductor device with its cone tip (as shown in FIGS. 2A and 2B).

Conventionally, in order to reduce the wear of the contact portion 14 of the probe head 10 and prolong the service life of the probe head 10, the contact portion 14 is usually made of materials with high hardness and high wear resistance, such as nickel and nickel alloy materials. During the test, the elastic member is stressed and deformed to generate the elastic force required for the probe, and this elastic force will be transmitted to the contact portion of the probe head, such that the contact portion has a vertical downward positive force with respect to the horizontal direction of the bump. Thereby, the contact portion can pierce the metal oxide on the surface of the bump to contact the bump, and establish an electrical signal exchange. Therefore, every time the contact portion 14 of the probe head 10 contacts with the bump 16, damaging recessed dents will be formed at the center or center region of the bump 16, and residual metal shavings that generated during contact will occur, thereby damaging the integrity of the bump, resulting in poor packaging yield. Moreover, the metal shavings remaining on the surface of the bump will affect the consistency and reliability of the electrical test results.

Since the above-mentioned many shortcomings and problems are presented in the conventional probe head, there is a requirement for a probe head capable of solving the above-mentioned problems in the semiconductor device test industry.

SUMMARY OF THE INVENTION

In view of the above-mentioned shortcomings of the conventional probe head, after in-depth research and experimental improvements, the inventor of the present invention has developed a novel probe head structure including a contact portion and a body portion, the contact portion includes an inclined-type contact structure away from the central region of the object to be tested, and the body includes a material having high hardness and high conductivity, which can effectively solve the above-mentioned shortcomings existing in the existing probe head, and can achieve the advantages such as more reliable probe detection performance and longer service life.

According to a first aspect of the present invention, a probe head for electrical detection of semiconductor devices is provided. The probe head comprises: a probe head body, which includes a first body portion having a contact end face, a second body portion, and a third body portion sequentially stacked and coupled in a direction of a central axis; and at least one contact portion in a shape of a polygon cone, which is coupled to the contact end face and disposed at a periphery of the contact end face, wherein each contact portion has an inclined edge or inclined plane facing the central axis, the inclined edge or inclined plane is inclined upward and outward from a portion close to the central axis, in order that when performing the electrical detection, the inclined edge or inclined plane contacts an object to be tested at a side portion of the object away from a central region thereof, and wherein the first body portion has a hardness greater than or equal to that of the at least one contact portion.

According to an embodiment, each of the at least one contact portion includes an inclined edge for contacting the object to be tested, which is inclined upward and outward from the bottom of each contact portion, and oriented to facing the center of the probe head body. Herein, the term "inclined edge" refers to a shape such as "straight line" or "straight line with curvature".

According to another embodiment, each of the at least one contact portion includes a inclined plane for contacting the object to be tested, which is inclined upward and outward from the bottom of each contact portion, and oriented to facing the center of the probe head body. Herein, the term "inclined plane" refers to a shape such as "plane" or "polygonal plane".

According to an embodiment, one end of the inclined edge or inclined plane of the at least one contact portion extends to intersect with the contact surface of the probe head body, and forms an included angle of about 40° to about 80° with the contact end face.

According to an embodiment, the second body portion has an outer diameter greater than each of outer diameters of the first and third body portions, thereby forming a flange of the probe head body, wherein the flange portion provides a position limiting space for riveting for the first body portion and the third body portion.

According to an embodiment, when viewed in a direction perpendicular to the contact end face of the probe head body, the at least one contact portion partially extends out of the range of the first body portion.

According to an embodiment, the at least one contact portion further includes a raising pad layer disposed between the respective contact portion and the first body portion.

According to an embodiment, the contact portion can include nickel or a nickel alloy.

According to an embodiment, the contact portion can include palladium or a palladium alloy.

According to an embodiment, the first body portion can include nickel or a nickel alloy.

According to an embodiment, the second body portion or the third body portion can include a material containing at least one element selected from a group consisting of nickel (Ni), tungsten (W), copper (Cu), boron (B), gold (Au), carbon (C), indium (In), ruthenium (Ru), tin (Sn) and rhodium (Rh).

According to an embodiment, the nickel alloy contains nickel (Ni) and at least one alloying element selected from a group consisting of iron (Fe), tungsten (W), copper (Cu), boron (B), carbon (C), cobalt (Co), silver (Ag), manganese (Mn), palladium (Pd) and rhodium (Rh).

According to an embodiment, the palladium alloy contains palladium (Pd) and at least one alloying element selected from a group consisting of nickel (Ni), molybdenum (Mo), copper (Cu), indium (In), carbon (C), cobalt (Co), silver (Ag) and manganese (Mn).

According to an embodiment, the contact portion has a hardness equal to or greater than 500 Vickers hardness (Hv), the first body portion has a hardness of about 700 to 1200 Vickers hardness, and each of the second body portion and the third body portion includes a material having a conductivity equal to or greater than 30% of that of international annealed standard copper.

According to an embodiment, the second body portion and the third body portion can be stacked alternately.

According to an embodiment, the inclined edge of the at least one contact portion has a length less than 650 microns.

According to an embodiment, the inclined plane of the at least one contact portion has an area less than 0.2 square millimeters.

According to an embodiment, the at least one contact portion includes two or more contact portions, and a distance between the two or more contact portions adjacent to each other is greater than or equal to 10 micrometers.

According to an embodiment, the end of the contact portion can be a tip or a micro-facet.

BRIEF DESCRIPTION OF THE DRAWINGS

The above-mentioned aspects, embodiments and other features of the present invention will be described below, with reference to the attached drawings, in conjunction with the accompanying drawings, in which.

DETAILED DESCRIPTION OF THE PREFERRED EMBODIMENT

Hereinafter, a probe head and a probe assembly for electrical detection of semiconductor devices according to the present invention will be described in detail with reference to FIGS. 3 to 13.

Figure 3:
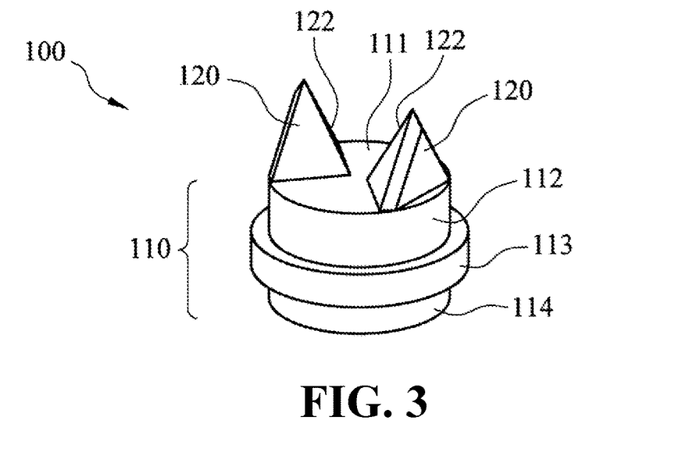
FIG. 3 is a schematic perspective view of a probe head according to a first embodiment of the present invention.
Figure 4:
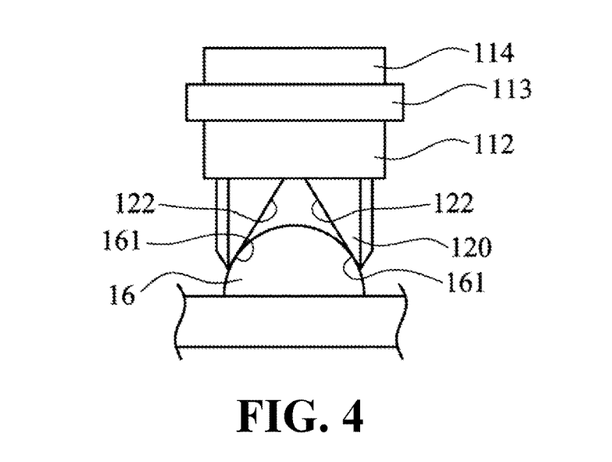
FIG. 4 is a schematic side view showing a contact between the probe head according to the first embodiment and a bump.
Figure 5:
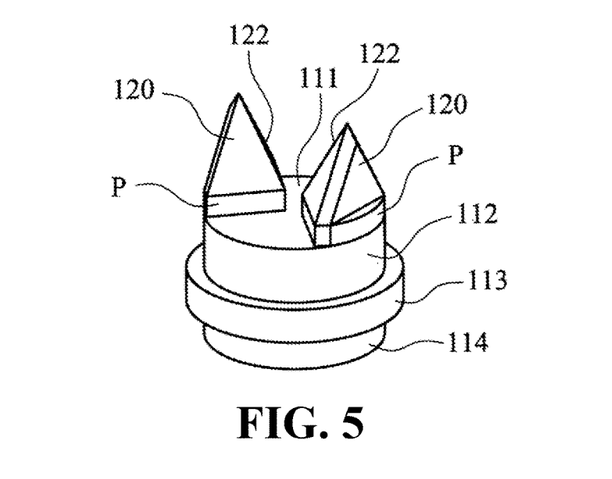
FIG. 5 is a schematic perspective view showing a variation of the first embodiment, in which the probe head includes a raising pad layer disposed between a contact portion and a first body portion.

FIG. 3 is a schematic perspective view of a probe head 100 according to a first embodiment of the present invention. As shown in FIG. 3, the probe head 100 according to the first embodiment includes: a probe head body 110 in a substantially cylindrical shape; and two contact portions 120 in a shape of polygon cone, which are coupled to the probe head body 110. In addition to the substantially cylindrical shape shown in FIG. 3, in other embodiments, the probe head body 110 can also be in other shapes, such as a shape of polygonal column. The probe head body 110 includes a plurality of body portions sequentially stacked and coupled in direction of a central axis. For example, the probe head body 110 comprises: a first body portion 112 having a contact end face 111 in which the two contact portions 120 are coupled to the contact end face 111; a second body portion 113, one end of which is coupled to another end of the first body portion 112; and a third body portion 114, one end of which is coupled to another end of the second body portion 113, wherein the second body portion 113 has an outer diameter greater than each of outer diameters of the first body portion 112 and the third body portion 114, thereby forming a flange portion of the probe head body 110; when being combined with a hollow pipe to form a probe assembly, the flange portion has a function of position-limiting and riveting the probe head 100 to the hollow pipe. Preferably, the first body portion 112 has a hardness greater than or equal to that of the two contact portions 120.

As shown in FIG. 3, the two contact portions 120 are disposed at the periphery of the contact end surface 111 and each contact portion 120 has an inclined edge 122, one end of the inclined edge 122 intersects with the contact end surface 111 of the probe head body 110. The inclined edge 122 forms an included angle of about 40° to about 80° with the contact end face 111, and is inclined upward and outward from a center close to the probe head body 110, such that the inclined edge 122 contacts the contact surface of a bump 16 (i.e., the object to be tested) at a side portion 161 of the bump 16 (see FIG. 4). Therefore, damaging dents will not be generated in the central region of the bump 16.

Although the inclined edge 122 is shown in the form of a "straight line" in FIG. 3, the inclined edge 122 may also be in a shape of a "slightly-curved straight line" with a slight curvature. Therefore, after the inclined edge 122 of the contact portion 120 contacts with the contact surface of the bump 16, a corresponding shape of "straight line" or "slightly-curved straight line" will form at the side portion 161 of the bump 16.

Since the inclined edge 122 of the contact portion 120 contacts with the bump 16 in a manner that the included angle therebetween is about 40° to 80°, the contact force that the bump 16 is subjected from the inclined edge 122 of the contact portion 120 will be reduced due to the component force in the horizontal direction, such that the friction between the inclined edge 122 of the contact portion 120 and the bump 16 is reduced, thereby improving the wear resistance of the contact portion 120. In other words, under the condition that the contact portion 120 has better or the same wear resistance, it can be made of a material having a hardness lower than that of nickel or nickel alloy, which can thereby meet a larger variety of test requirements while maintaining wear resistant functions.

More specifically, on the premise of not affecting the wear resistance of the contact portion 120, the material of the contact portion 120 can be changed from nickel or nickel alloy material with high wear resistance to palladium or palladium alloy material with lower wear resistance, wherein the palladium or palladium alloy material has the characteristic of not sticking to the material of the bump 16, and will not generate magnetic attraction effect as nickel or nickel alloy material, which can meet the test requirements of high frequency, thereby can form the contact portion 120 having the characteristics of wear resistance and high frequency while meeting the test requirements of wear resistance and high frequency.

On the other hand, if the included angle of the inclined edge 122 is less than 40°, the component force in the vertical direction from the inclined edge 122 will be too small, thereby a loose contact may be occurred between the contact portion 120 and the bump 16, resulting in poor telecommunication transmission. On the contrary, if the included angle of the inclined edge 122 is greater than 80°, the component force in the vertical direction from the inclined edge 122 will be too large, which is prone to damage the integrity of the bump 16.

Further, the contact portion 120 can have a hardness equal to or greater than about 500 Vickers hardness (Hv). The contact portion 120 may include nickel or nickel alloy, and the nickel alloy may also contains, in addition to nickel (Ni), at least one alloying element selected from a group consisting of iron (Fe), tungsten (W), copper (Cu), boron (B), carbon (C), cobalt (Co), silver (Ag), manganese (Mn), palladium (Pd) and rhodium (Rh).

The contact portion 120 may also include palladium or palladium alloy, and the palladium alloy may also contains, in addition to palladium (Pd), at least one alloying element selected from a group consisting of nickel (Ni), molybdenum (Mo), copper (Cu), indium (In), carbon (C), cobalt (Co), silver (Ag) and manganese (Mn).

Further, the inclined edge 122 of the one contact portion 122 may have a length less than 650 microns.

In addition, a raising pad layer P (see FIG. 5) may be provided between each contact portion 120 and the first body portion 112, the raising pad layer P can increase the distance between the free end of the contact portion 120 and the first body portion 112.

Figure 6A:
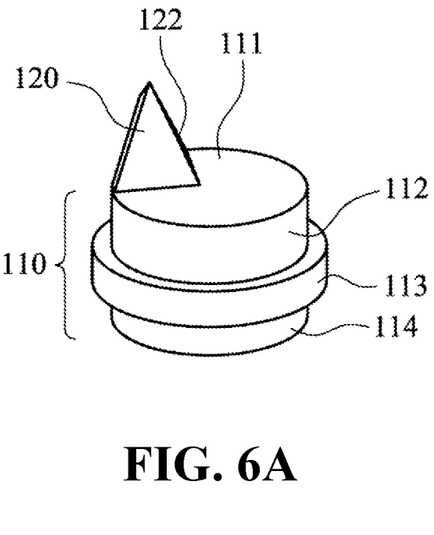
FIGS. 6A and 6B, and FIGS. 6C and 6D are schematic perspective views showing the aspects of the first embodiment in which the probe head includes one and four contact portions, respectively.
Figure 6B:
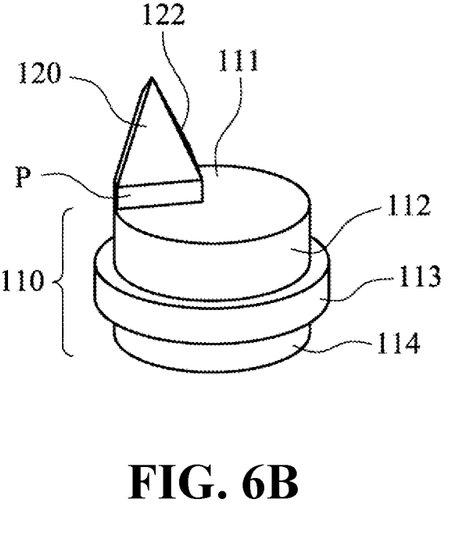
Figure 6C:
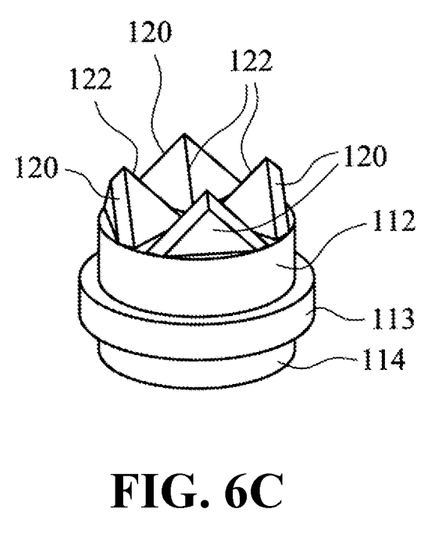
Figure 6D:
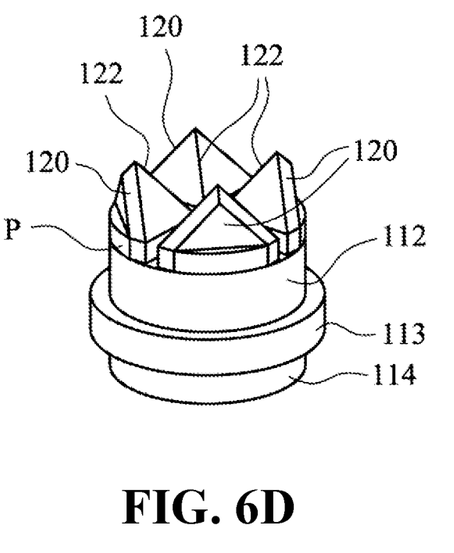
Figure 7:
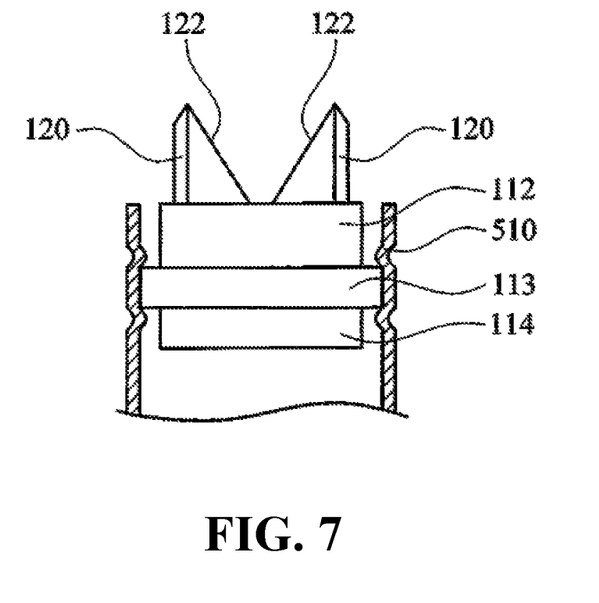
FIG. 7 is a partial cross-sectional side view showing the riveting structure between the probe head and the hollow pipe according to the first embodiment.

Although the probe head 100 of the embodiment shown in FIG. 3 includes two contact portions 120, the probe head of the present invention may actually include at least one contact portion. For example, in other embodiments, the probe head of the present invention may include one contact portion (as shown in FIGS. 6A and 6B), three contact portions, four contact portions (as shown in FIGS. 6C and 6D), five contact portions, seven contact parts, and so on.

The first body portion 112 has a hardness greater than or equal to that of the contact portion 120. In other words, the first body portion 112 is a more rigid structure, thereby reducing the mechanical impact of the contact portion 120 during the test operation, and obtaining relatively stable contact electrical signals; in this embodiment, the first body portion 112 has a hardness of about 700 to 1200 Vickers hardness.

The second body portion 113 and the third body portion 114 include a material having a conductivity equal to or greater than 30% of that of international annealed standard copper, which can provide better electrical conductivity when riveted with pipe. Further, the second body portion 113 has an outer diameter greater than each of outer diameters of the first body portion 112 and the third body portion 114, thereby forming a flange. Through such flange structure, the first body portion 112 and the third body portion 114 form a position limiting space capable of positioning and firmly fixing the second body portion 113. For example, when the probe head 100 is riveted to one end of a hollow pipe 510 of the probe assembly, by the recessed deformation of the hollow pipe 510 into the position limiting space of the first body portion 112 and the third body portion 114, the relative movement of the probe head 100 in the hollow pipe 510 can be limited, and the probe head 100 can be riveted to the hollow pipe 510 (see FIG. 7).

Figure 8A:
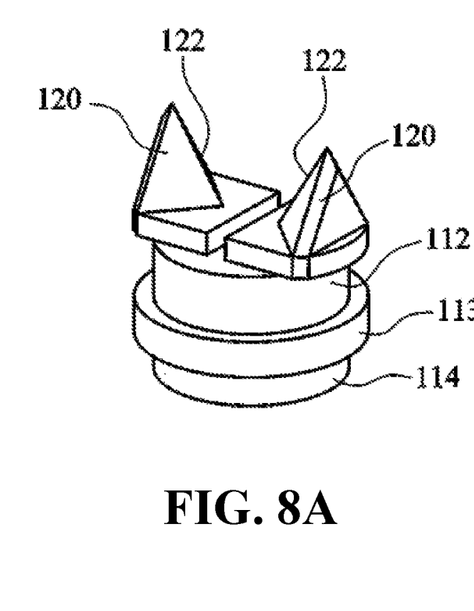
FIGS. 8A and 8B are schematic perspective views showing that the contact portion according to the first embodiment is configured to at least partially extend out of a periphery of a contact end face.
Figure 8B:
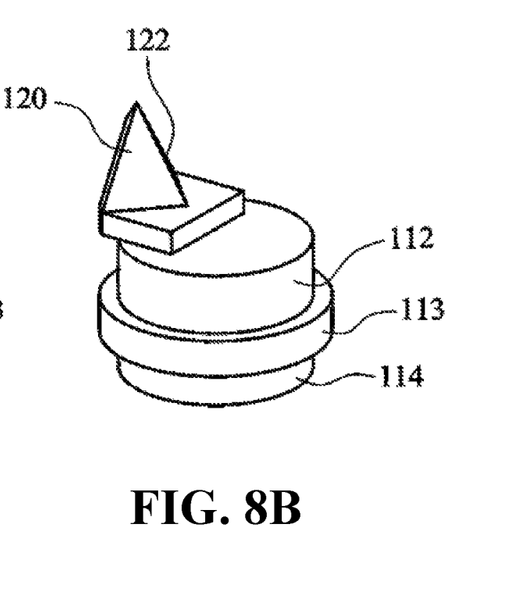

Although in the embodiment shown in FIG. 3, the contact portion 120 is disposed at the periphery of the contact end face 111 of the probe body 110 and within the range of the contact end face 111; however, in other embodiments, the contact portion 120 may also be configured to at least partially extend out of the range of the contact end face 111, as shown in FIGS. 8A and 8B.

Figure 9:
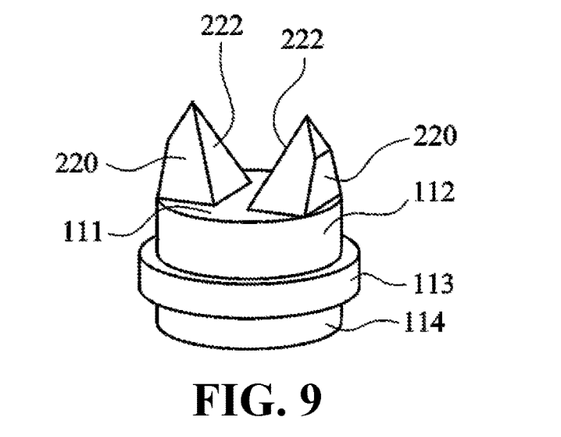
FIG. 9 is a schematic perspective view of a probe head according to a second embodiment of the present invention.

Next, a probe head 200 according to a second embodiment of the present invention will be described with reference to FIGS. 9 to 12D, wherein FIG. 9 is a schematic perspective view of a probe head 200 according to the second embodiment.

As shown in FIG. 9, the probe head 200 according to the second embodiment includes: a probe head body 110 same as the first embodiment; and a contact portion 220 in a shape of polygon cone, which is coupled to the probe head body 110. In the following description, only the features of the second embodiment different from the first embodiment will be described.

Figure 10:
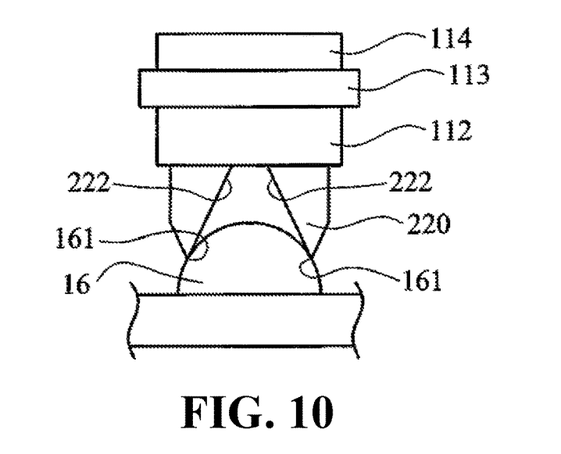
FIG. 10 is a schematic side view showing a contact between the probe head according to the second embodiment and a bump.
Figure 11:
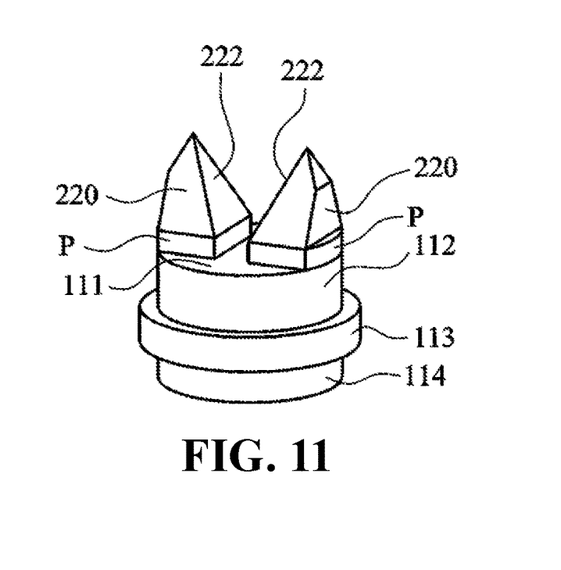
FIG. 11 is a schematic perspective view showing a variation of the second embodiment, in which the probe head includes a raising pad layer disposed between a contact portion and a first body portion.

As shown in FIG. 9, the probe head 200 according to the second embodiment is different from the first embodiment in that: the contact portion 220 of the probe head 200 according to the second embodiment has a inclined plane 222 toward the center of the probe head 200, one end of the inclined plane 222 extends towards the probe head body 110 and intersects with the contact end surface 111 of the probe head body 110; the inclined plane 222 forms an included angle of about 40° to about 80° with the contact end face 111, and is inclined upward and outward from a center close to the probe head body 110, such that the inclined plane 222 contacts the main body of the bump 16 at the side portion 161 of the main body of the bump 16 (see FIG. 10). Therefore, damaging dents will not be generated in the central region of the bump 16.

According to the second embodiment of the present invention, after the inclined plane 222 of each contact portion 220 contacts with the contact surface of the main body of the bump 16, a shape of "plane" or "polygonal plane" will form at the side portion 161 of the main body of the bump 16.

According to the second embodiment of the present invention, the inclined plane 222 of each contact portion 220 has an area less than 0.2 square millimeters.

Figure 12A:
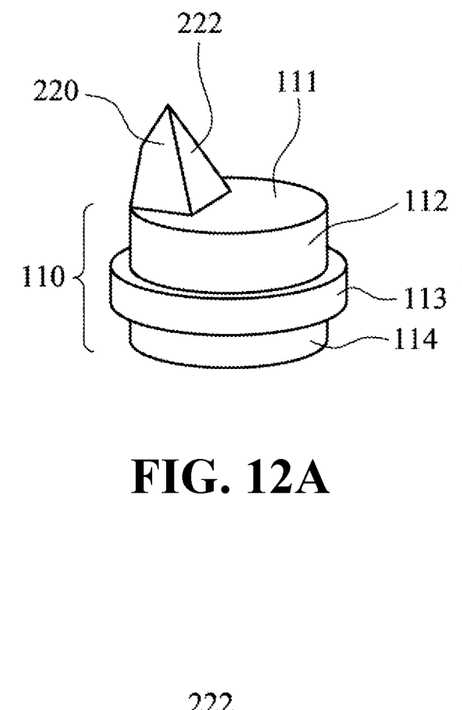
FIGS. 12A and 12B, and FIGS. 12C and 12D are schematic perspective views showing the aspects of the second embodiment in which the probe head includes one and four contact portions, respectively.
Figure 12B:
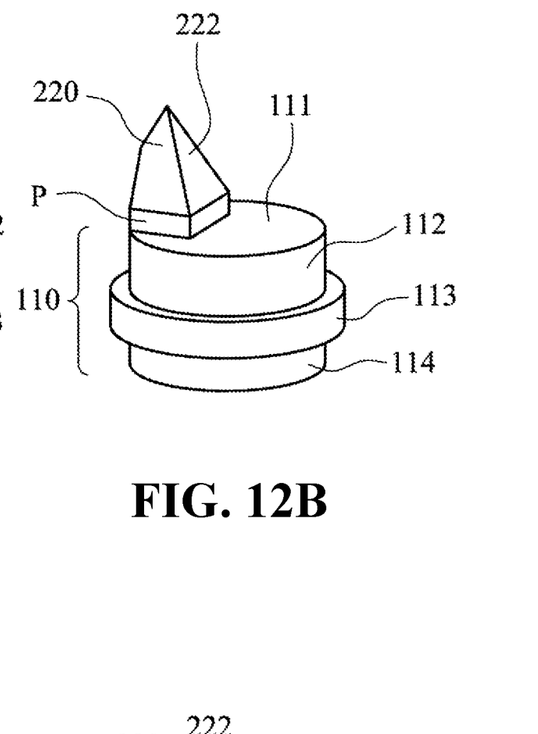
Figure 12C:
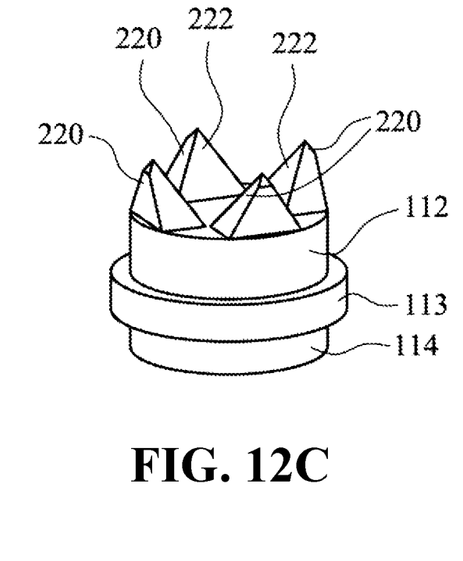
Figure 12D:
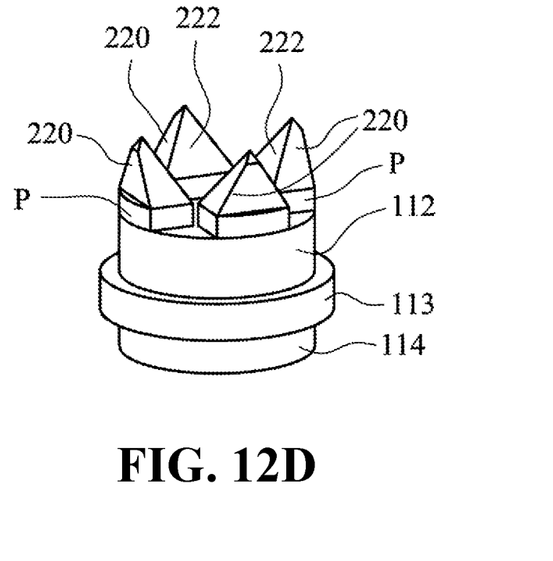

Similar to the first embodiment, in the second embodiment, a raising pad layer P (see FIG. 11) may also be provided between each contact portion 220 and the first body portion 112, the raising pad layer P can increase the distance between the free end of the contact portion 220 and the first body portion 112. In addition, the probe head according to the second embodiment may also include at least one contact portion, for example, one contact portion (as shown in FIGS. 12A and 12B), three contact portions, four contact portions (as shown in FIGS. 12C and 12D), five contact portions, seven contact parts, and so on.

Figure 13:
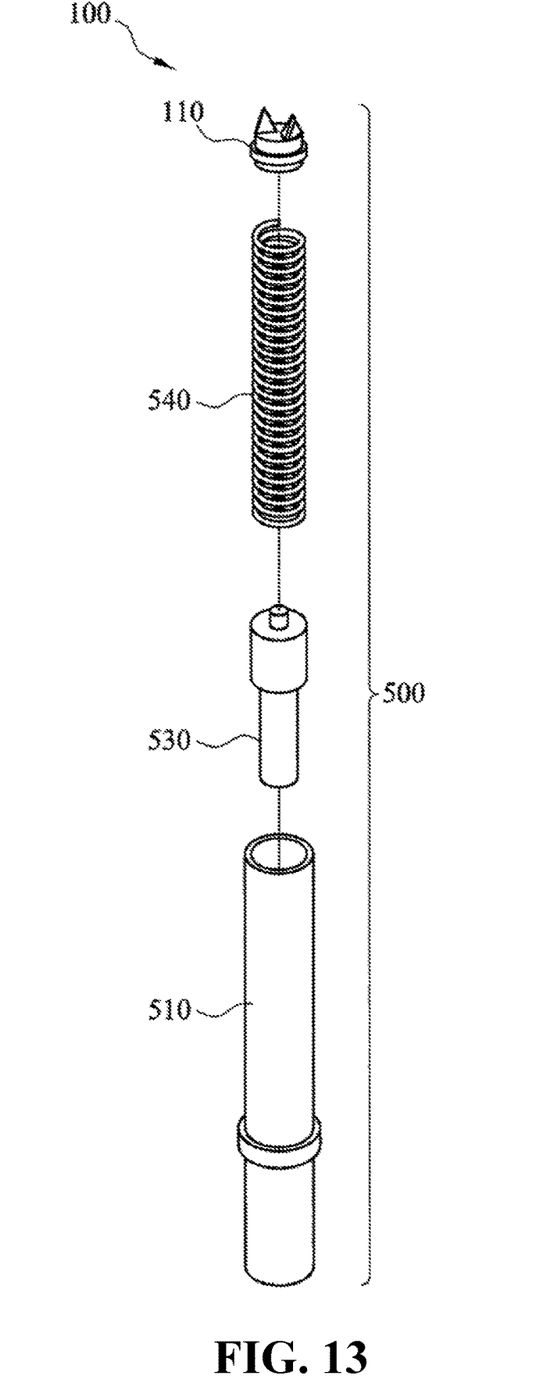
FIG. 13 is a schematic exploded view of a probe assembly for electrical detection of semiconductor devices according to a second aspect of the present invention including the probe head of the present invention.

Next, a probe assembly 500 including the probe head of the present invention will be described with reference to FIG. 13. As shown in FIG. 13, the probe assembly 500 includes: a hollow pipe 510; a probe head according to the above aspects of the present invention (for example, the probe head 100 shown in FIG. 3) in which the probe head body 110 is at least partially inserted into one open end of the hollow pipe 510 and coupled to the hollow pipe 510; a plunger 530, which is at least partially placed into the hollow pipe 510 from another open end of the hollow pipe 510; and a spring 540, which is disposed between the probe head 510 and the plunger 530 within the hollow pipe 510, one end of the a spring 540 abuts against the probe head 510 for biasing the probe head 510 axially outward, another end of the a spring 540 abuts against the plunger 530. The coupling between the probe head 100 and the hollow pipe 510 is completed by rivet-fixing the probe head 100 to one end of the hollow pipe 510 through a riveting process by the position limiting space at the upper and lower sides of the flange formed by the second body portion 113 of the probe head body 110 (see FIG. 7).

Although the aspects and exemplary embodiments of the probe head and probe assembly of the present invention have been described with reference to the preferred embodiments as shown in the drawings, it is not indicate that the present invention is limited to only the features and structures described in the above description and shown in the drawings. The above-mentioned embodiments are merely examples. It is possible for those skilled in the art to combine the contents of the above-mentioned embodiments with each other. All other possible modifications and variations of the present invention fall within the actual scope of the present invention as defined by the claims and their equivalents.

What is claimed is:

1. A probe head for electrical detection of semiconductor devices, comprising:
  a probe head body, which includes a first body portion having a contact end face, a second body portion, and a third body portion sequentially stacked and coupled in a direction of a central axis; and
  at least one contact portion in a shape of a polygon cone, which is coupled to the contact end face and disposed at a periphery of the contact end face, wherein each contact portion has an inclined edge with a length less than 650 microns or an inclined plane with an area less than 0.2 square millimeters facing the central axis,
  wherein the inclined edge or inclined plane is inclined upward and outward from a portion close to the central axis, in order that when performing the electrical detection, the inclined edge or inclined plane contacts an object to be tested at a side portion of the object away from a central region thereof.

2. The probe head according to claim 1, wherein the inclined edge or inclined plane forms an included angle of about 40° to about 80° with the contact end face.

3. The probe head according to claim 1, wherein the second body portion has an outer diameter greater than each of an outer diameter of the first body portion and an outer diameter of the third body portion, thereby forming a flange portion of the probe head body, wherein the flange portion provides a position limiting space for riveting for the first body portion and the third body portion.

4. The probe head according to claim 1, wherein the first body portion has a hardness greater than or equal to that of the at least one contact portion.

5. The probe head according to claim 1, wherein the at least one contact portion includes nickel or a nickel alloy.

6. The probe head according to claim 5, wherein the nickel alloy contains nickel (Ni) and at least one alloying element selected from a group consisting of iron (Fe), tungsten (W), copper (Cu), boron (B), carbon (C), cobalt (Co), silver (Ag), manganese (Mn), palladium (Pd) and rhodium (Rh).

7. The probe head according to claim 1, wherein the at least one contact portion includes palladium or a palladium alloy.

8. The probe head according to claim 7, wherein the palladium alloy contains palladium (Pd) and at least one alloying element selected from a group consisting of nickel (Ni), molybdenum (Mo), copper (Cu), indium (In), carbon (C), cobalt (Co), silver (Ag) and manganese (Mn).

9. The probe head according to claim 1, wherein the first body portion includes nickel or a nickel alloy.

10. The probe head according to claim 9, wherein the nickel alloy contains nickel (Ni) and at least one alloying element selected from a group consisting of iron (Fe), tungsten (W), copper (Cu), boron (B), carbon (C), cobalt (Co), silver (Ag), manganese (Mn), palladium (Pd) and rhodium (Rh).

11. The probe head according to claim 1, wherein the second body portion and the third body portion include a material containing at least one element selected from a group consisting of nickel (Ni), tungsten (W), copper (Cu), boron (B), gold (Au), carbon (C), indium (In), ruthenium (Ru), tin (Sn) and rhodium (Rh).

12. The probe head according to claim 1, wherein the at least one contact portion has a hardness equal to or greater than about 500 Vickers hardness.

13. The probe head according to claim 1, wherein the first body portion has a hardness of about 700 to 1100 Vickers hardness.

14. The probe head according to claim 1, wherein the second body portion and the third body portion include a material having a conductivity equal to or greater than 30% of that of international annealed standard copper.

15. The probe head according to claim 1, wherein the at least one contact portion includes two or more contact portions, and a distance between the two or more contact portions adjacent to each other is greater than or equal to 10 micrometers.

16. A probe assembly, comprising:
   a hollow pipe;
   the probe head according to claim 1, in which the probe head body of the probe head is at least partially inserted into the hollow pipe from one end of the hollow pipe and coupled to the hollow pipe;
   a plunger partially placed into the hollow pipe from another end of the hollow pipe; and
   a spring disposed between the probe head and the plunger within the hollow pipe, for biasing the probe head axially outward of the hollow pipe.

17. The probe assembly according to claim 16, wherein a coupling between the probe head and the hollow pipe is completed by fixing the probe head to the hollow pipe through a riveting process by a position limiting space at the first body portion and the third body portion of the probe head body.

18. A probe head for electrical detection of semiconductor devices, comprising:
   a probe head body, which includes a first body portion having a contact end face, a second body portion, and a third body portion sequentially stacked and coupled in a direction of a central axis; and
   at least one contact portion in a shape of a polygon cone, which is coupled to the contact end face and disposed at a periphery of the contact end face, wherein the at least one contact portion includes a raising pad layer disposed between the respective contact portion and the first body portion, and each contact portion has an inclined edge or an inclined plane facing the central axis,
   wherein the inclined edge or inclined plane is inclined upward and outward from a portion close to the central axis, in order that when performing the electrical detection, the inclined edge or inclined plane contacts an object to be tested at a side portion of the object away from a central region thereof.

* * * * *